United States Patent
Lee et al.

(10) Patent No.: US 7,132,690 B2
(45) Date of Patent: Nov. 7, 2006

(54) MULTI-CHANNEL TYPE THIN FILM TRANSISTOR AND METHOD OF FABRICATING THE SAME

(75) Inventors: Seok-Woo Lee, Gyeonggido (KR); Jae-Sung Yu, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/118,471

(22) Filed: May 2, 2005

(65) Prior Publication Data

US 2005/0242349 A1  Nov. 3, 2005

(30) Foreign Application Priority Data

May 3, 2004 (KR) .................. 10-2004-0030882

(51) Int. Cl.
*H01L 29/04* (2006.01)
(52) U.S. Cl. .................. 257/72; 257/59; 257/344; 257/401; 257/408; 257/E29.278; 257/E29.299
(58) Field of Classification Search .................. 257/59, 257/72

See application file for complete search history.

(56) References Cited

U.S. PATENT DOCUMENTS

| | | | |
|---|---|---|---|
| 5,021,850 A * | 6/1991 | Tanaka et al. | 257/59 |
| 6,888,182 B1 * | 5/2005 | Mitani et al. | 257/241 |
| 6,919,933 B1 * | 7/2005 | Zhang et al. | 349/43 |
| 2005/0139835 A1 * | 6/2005 | Lee | 257/72 |

FOREIGN PATENT DOCUMENTS

| | | |
|---|---|---|
| JP | 10-270699 | 10/1998 |
| KR | 2003-0087919 | 11/2003 |

OTHER PUBLICATIONS

Satoshi Inoue, et al., Analysis of Threshold Voltage Shift Caused by Bias Stress in Low Temperature Poly-Si TFTs, IEDM 97, Jul. 1997, pp. 527-530.

* cited by examiner

*Primary Examiner*—Kenneth Parker
*Assistant Examiner*—José R. Diaz
(74) *Attorney, Agent, or Firm*—Morgan, Lewis & Bockius, LLP

(57) ABSTRACT

A multi-channel type thin film transistor includes a gate electrode over a substrate extending along a first direction, a plurality of active layers parallel to and spaced apart from each other extending along a second direction crossing the first direction, and source and drain electrodes spaced apart from each other with respect to the gate electrode and extending along the first direction, wherein each of the plurality of active layers includes a channel region overlapped with the gate electrode, a source region, a drain region, and lightly doped drain (LDD) regions, one between the channel region and the source region and another one between the channel region and the drain region, wherein the LDD regions of the adjacent active layers have different lengths from each other.

17 Claims, 11 Drawing Sheets

US 7,132,690 B2

MULTI-CHANNEL TYPE THIN FILM TRANSISTOR AND METHOD OF FABRICATING THE SAME

The present invention claims the benefit of Korean Patent Application No. 2004-30882 filed in Korea on May 3, 2004, which is hereby incorporated by reference.

BACKGROUND OF THE INVENTION

1. Field of the Invention

The present invention relates to a thin film transistor (TFT) for a flat panel display (FPD) device, and more particularly, to a multi-channel type TFT and a method of fabricating the same that can prevent deterioration thereof.

2. Discussion of the Related Art

Recently, FPD devices, which includes liquid crystal display (LCD) devices, are manufactured as large-size display devices that have high resolution due to implementation of semiconductor devices in the FPD devices.

In general, the LCD devices use optical anisotropy and polarization properties of liquid crystal molecules in order to display images. The liquid crystal molecules have a definite orientational alignment resulting from their thin and long shapes, wherein the alignment direction of the liquid crystal molecules can be controlled by application of an electric field to the liquid crystal molecules. Accordingly, as an intensity of the applied electric field is changed, the alignment of the liquid crystal molecules also changes. Since incident light through liquid crystals within the liquid crystal molecules is refracted based upon an orientation of the liquid crystal molecules, intensity of the incident light can be controlled and images can be displayed due to the optical anisotropy of the aligned liquid crystal molecules.

Among the various types of LCD devices commonly used, active matrix LCD (AM-LCD) devices have been developed because of their high resolution and superiority in displaying moving images. The AM-LCD devices have TFTs and pixel electrodes connected to the TFTs disposed in matrix configuration. The TFTs include polysilicon material having a higher field efficiency mobility than amorphous silicon material that is sensitive to light or to electric fields when the polysilicon material is utilized for a driving integrated circuit element, i.e., the TFT element. Accordingly, the polysilicon TFT can reduce costs of the driving integrated circuit and can help simplify device packaging when the polysilicon material is directly formed on a substrate as the driving integrated circuit.

The polysilicon TFT can minimize current loss of an ON state to provide a fast mobility speed of the driving IC and pixels, and has a relatively low power consumption. In addition, a lightly doped drain (LDD) region, which is treated with impurities of a lower concentration than the n+ or p+ doping concentrations of the source/drain regions that prevent leakage current increase, is defined in the polysilicon TFT. Furthermore, the electric field of a drain electrode of the TFT can be reduced by the LDD region having a low consistency, thereby reducing deterioration of the device by hot carriers.

FIG. 1 is a schematic plan view of a multi-channel type TFT according to the related art. The multi-channel type TFT 50 of FIG. 1 is manufactured in order to increase driving power and to prevent deterioration due to self-heating. In FIG. 1, a gate electrode 26 is formed over a substrate (not shown) to extend along a first direction, and source and drain electrodes 34 and 38 are spaced apart from each other with respect to the gate electrode 26 and extend along the first direction. A plurality of active layers $ACT_1$ to $ACT_{2N}$ (N is defined a positive fixed number) are disposed parallel to and spaced apart from each other along a second direction crossing the first direction, wherein each of the plurality of active layers $ACT_1$ to $ACT_{2N}$ includes a channel region CR overlapped with the gate electrode 26, a source region SR, a drain region DR, and lightly doped drain (LDD) regions LR; one between the channel region CR and the source region SR and another one between the channel region CR and the drain region DR. Here, the plurality of active layers $ACT_1$ to $ACT_{2N}$ include a polysilicon material. However, a distance D1 between adjacent active layers $ACT_1$ to $ACT_{2N}$ are limited since a size of an integrated circuit is limited by an integrated characteristic of a high density of the LCD although a width W1 of each of the active layers $ACT_1$ to $ACT_{2N}$ is widened. As a result, the layout of the multi-channel type TFT is limited.

FIG. 2 is a graphic illustration of heating values of channel regions of the multi-channel TFT of FIG. 1 according to the related art. In FIG. 2, a central portion CP of the multi-channel type TFT 50 has a bigger disadvantage than edge portions EP thereof since a space of the heat diffusion and a route of the heat diffusion are both relatively narrow. In general, cooling in the central portion CP is more difficult than in the edge portions EP.

FIG. 3 is a photomicrograph of a central portion of the multi-channel type TFT according to the related art. In FIG. 3, the multi-channel type TFT has a significant disadvantage, such as deterioration due to self-heating. Therefore, since its cost increases, productivity is reduced.

SUMMARY OF THE INVENTION

Accordingly, the present invention is directed to a multi-channel type TFT and a method of fabricating the same that substantially obviates one or more of the problems due to limitations and disadvantages of the related art.

An object of the present invention is to provide a multi-channel type TFT having improved resistance to deterioration.

Another object of the present invention is to provide a method of fabricating a multi-channel type TFT that prevents increases of thermal cooling inefficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a multi-channel type thin film transistor includes a gate electrode over a substrate extending along a first direction, a plurality of active layers parallel to and spaced apart from each other extending along a second direction crossing the first direction, and source and drain electrodes spaced apart from each other with respect to the gate electrode and extending along the first direction, wherein each of the plurality of active layers includes a channel region overlapped with the gate electrode, a source region, a drain region, and lightly doped drain (LDD) regions, one between the channel region and the source region and another one between the channel region and the drain region, wherein the LDD regions of the adjacent active layers have different lengths from each other.

In another aspect, a method of fabricating a multi-channel type thin film transistor includes forming a plurality of active layers on a substrate extending along a first direction, the plurality of active layers extending parallel to and spaced apart from each other, each of the plurality of active layers including a channel region overlapped with a gate electrode, a source region, a drain region, and lightly doped drain (LDD) regions, one between the channel region and the source region and another one between the channel region and the drain region, forming a gate-insulating layer on the plurality of active layers, forming the gate electrode on the gate-insulating layer extending along a second direction crossing the first direction, the gate electrode overlapping the channel region, doping the LDD region with impurities of a first concentration, the LDD regions of the adjacent active layers have different lengths from each other, doping the source and drain regions with impurities of a second concentration larger than the first concentration, and forming source and drain electrodes over the gate electrode extending along the second direction, the source and drain electrodes spaced apart from each other and connected to the source and drain regions.

In another aspect, a multi-channel type thin film transistor includes a gate electrode over a substrate extending along a first direction, source and drain electrodes spaced apart from each other with respect to the gate electrode extending along the first direction, and a plurality of active layers extending parallel to and spaced apart from each other along a second direction crossing the first direction, each of the plurality of active layers including a channel region overlapped with the gate electrode, a source region in one side of the channel region, a drain region in another side of the channel region, wherein overlapping widths of the gate electrode with the adjacent active layers are different from each other and channel lengths of the adjacent channel regions different from each other.

In another aspect, a method of fabricating a multi-channel type thin film transistor includes forming a plurality of active layers on a substrate extending along a first direction, the plurality of active layers extend parallel to and spaced apart from each other, each of the plurality of active layers including a channel region overlapped with a gate electrode, a source region in one side of the channel region, and a drain region in another side of the channel region, forming a gate-insulating layer on the plurality of active layers, forming the gate electrode on the gate-insulating layer extending along a second direction crossing the first direction, overlapping widths of the gate electrode with the adjacent active layers are different from each other and channel lengths of the adjacent channel regions are different from each other, doping the source and drain regions, and forming source and drain electrodes over the gate electrode extending along the second direction, the source and drain electrodes are spaced apart from each other with respect to the gate electrode and are connected to the source and drain regions.

In another aspect, a multi-channel type thin film transistor includes a gate electrode over a substrate extending along a first direction, source and drain electrodes spaced apart from each other with respect to the gate electrode extending along the first direction, a plurality of active layers extending parallel to and spaced apart from each other along a second direction crossing the first direction, each of the plurality of active layers including a channel region overlapped with the gate electrode, a source region in one side of the channel region, and a drain region in another side of the channel region, an interlayer between the gate electrode and the source and drain electrode, the interlayer having a plurality of contact holes that partially expose the gate electrode, and a plurality of contact patterns on the interlayer, the contact patterns contact the gate electrode through the plurality of contact holes, wherein the plurality of contact patterns including the same material as the source and drain electrodes.

In another aspect, a method of fabricating a multi-channel type thin film transistor includes forming a plurality of active layers on a substrate extending along a first direction, the plurality of active layers extend parallel to and spaced apart from each other, each of the plurality of active layers including a channel region overlapped with a gate electrode, a source region in one side of the channel region, and a drain region in another side of the channel region, forming a gate-insulating layer on the plurality of active layers, forming the gate electrode on the gate-insulating layer extending along a second direction crossing the first direction, doping the source region and the drain region, forming source and drain electrodes over the gate electrode extending along the second direction, the source and drain electrodes spaced apart from each other with respect to the gate electrode and connected to the source and drain regions, forming an interlayer between the gate electrode and the source and drain electrodes, the interlayer having a plurality of contact holes that partially expose the gate electrode, and forming a plurality of contact patterns contacting the gate electrode through the plurality of contact holes, the plurality of contact patterns include the same material as the source and drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
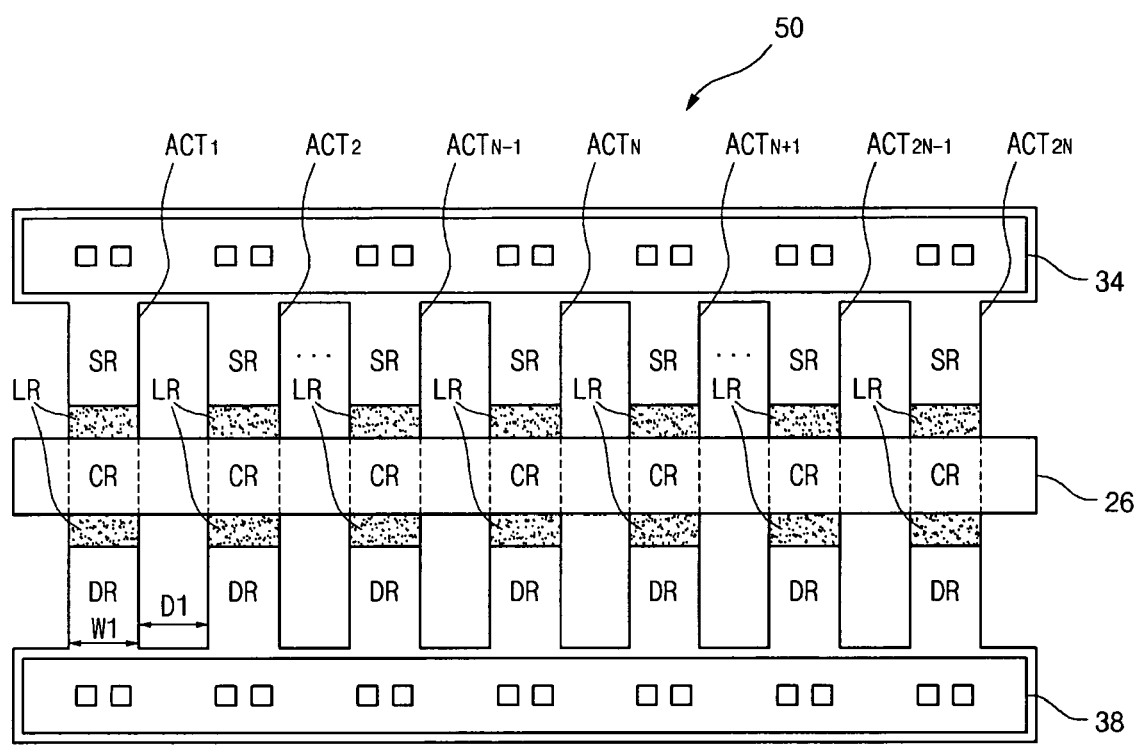
FIG. 1 is a schematic plan view of a multi-channel type TFT according to the related art.
Figure 2:
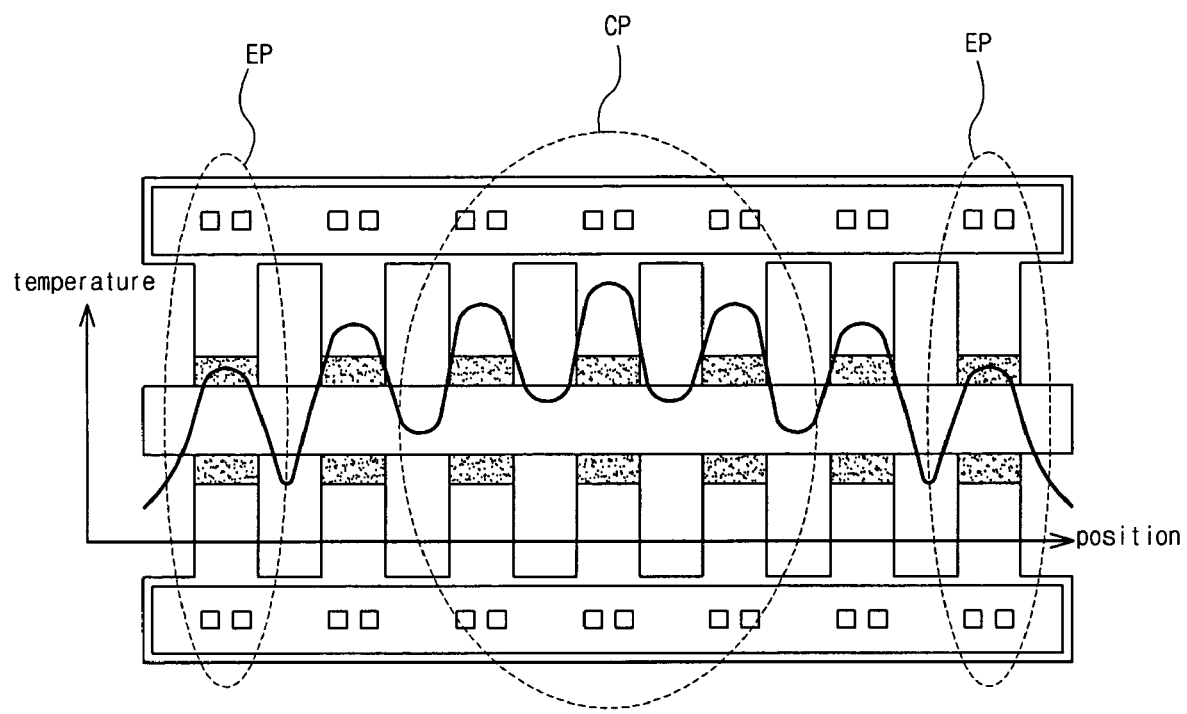
FIG. 2 is a graphic illustration of heating values of channel regions of the multi-channel TFT of FIG. 1 according to the related art.
Figure 3:
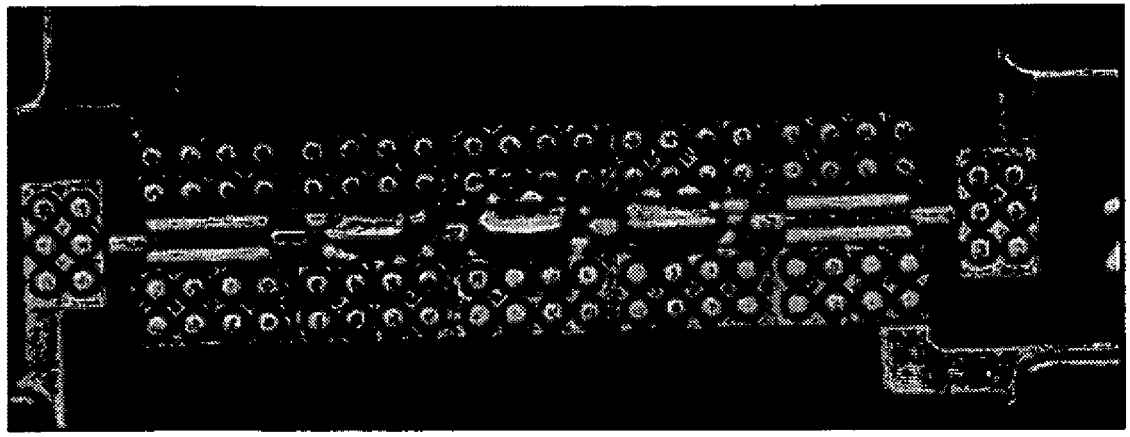
FIG. 3 is a photomicrograph of a central portion of the multi-channel type TFT according to the related art.
Figure 4:
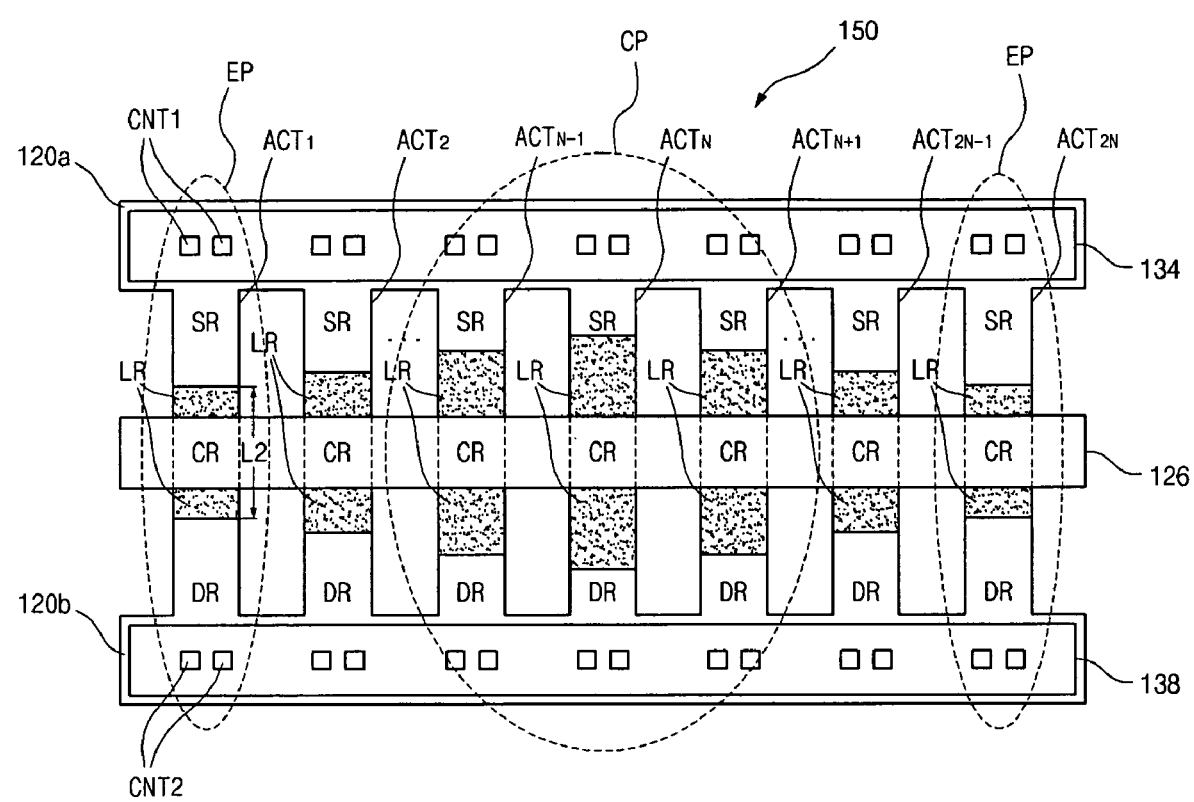
FIG. 4 is a schematic plan view of an exemplary multi-channel type TFT according to the present invention.

FIG. 4 is a schematic plan view of an exemplary multi-channel type TFT according to the present invention. In FIG. 4, a gate electrode 126 is formed over a substrate (not shown) to extend along a first direction, source and drain electrodes 134 and 138 are spaced apart from each other with respect to the gate electrode 126 and also extend along the first direction. A plurality of active layers $ACT_1$ to $ACT_{2N}$ are disposed parallel to and spaced apart from each other along a second direction crossing the first direction. In addition, each of the plurality of active layers $ACT_1$ to $ACT_{2N}$ (N is defined a positive fixed number) includes a channel region CR overlapped with the gate electrode 126, a source region SR, a drain region DR, and lightly doped drain (LDD) regions LR; one between the channel region CR and the source region SR and another between the channel region CR and the drain region DR. Moreover, the LDD regions LR of the adjacent active layers $ACT_1$ to $ACT_{2N}$ have different lengths from each other. More specifically, a length L2 of the LDD region LR of a central portion CP is longer than a length L2 of the LDD region of an edge portion EP. The LDD regions LR have a symmetrical size with respect to the central portion CP.

In FIG. 4, sizes of the LDD regions LR gradually increase toward the central portion CP. In addition, the plurality of active layers $ACT_1$ to $ACT_{2N}$ diverge from first and second connecting patterns 120a and 120b, wherein each of the active layers $ACT_1$ to $ACT_{2N}$ is connected to the source and drain regions SR and DR, respectively. Moreover, the first and second connecting patterns 120a and 120b are connected to the source and drain regions SR and DR via first and second contact holes CNT 1 and CNT 2 of an interlayer (not shown), respectively. Alternatively, the plurality of active layers $ACT_1$ to $ACT_{2N}$ may be independently connected to the source and drain regions SR and DR without the first and second connecting patterns 120a and 120b. That is, lengths of the LDD regions LR of the central portion CP are increased more than lengths of the LDD regions LR of the edge portions, thereby reducing a current in the central active layers $ACT_{N-1}$ to $ACT_{N+1}$ due to an increase of the length L2 of the LDD region LR.

In general, power consumed in the multi-channel type TFT 150 is proportional to a drain current (Id). As a result, heating value is also proportional to the drain current (Id).

$$\text{Power}(\propto \text{heat}) = Id \times Vd \tag{1}$$

Here, because the drain current (Id) is generally inversely-proportional to the length L2 of the LDD region LR, the drain current (Id) where the central portion CP as a relatively high heating value due to a heating emission, is reduced. Thus, the temperature by the heat emission can be reduced.

Figure 5:
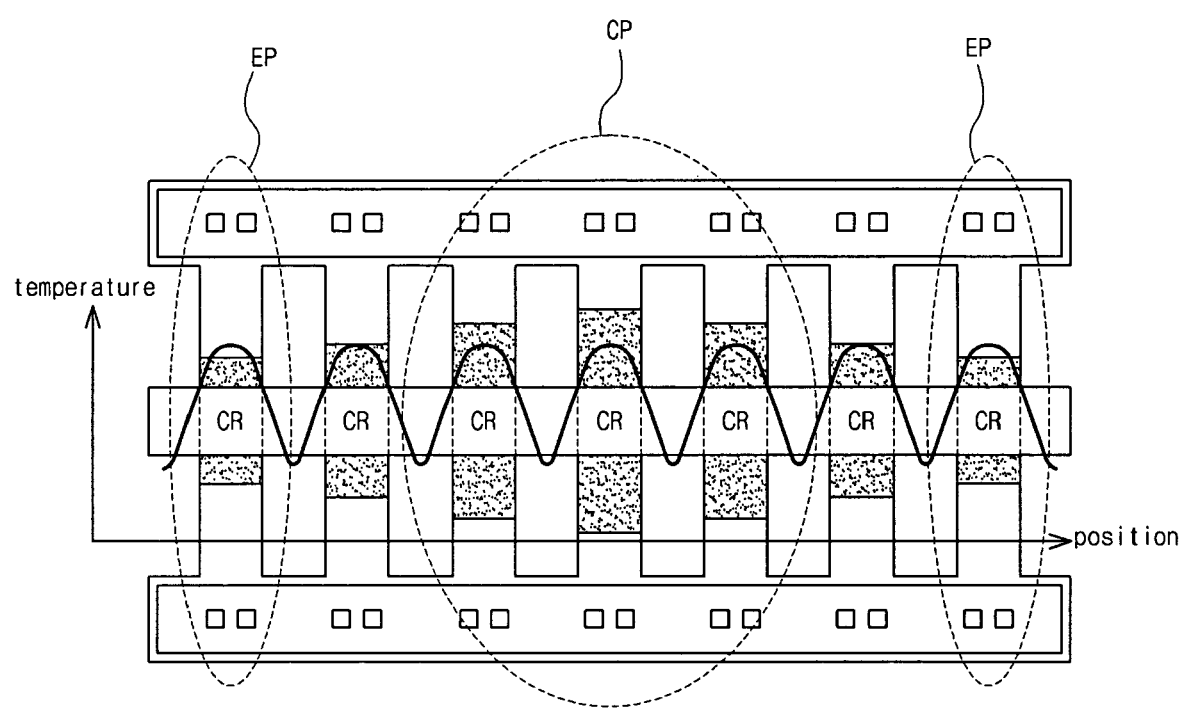
FIG. 5 is a graphic illustration of heating values of channel regions of the multi-channel type TFT of FIG. 4 according to the present invention in FIG. 4.

FIG. 5 is a graphic illustration of heating values of channel regions of the multi-channel type TFT of FIG. 4 according to the present invention in FIG. 4. In FIG. 5, in order to control amounts of the current applied to each channel region CR, the LDD regions LR of the central active layers $ACT_{N-1}$ to $ACT_{N+1}$ are larger than the LDD regions LR of the side active layers $ACT_1$ and $ACT_{2N}$. Here, the LDD regions LR have symmetrical sizes with respect to the LDD regions LR of the central portion CP in order to uniformly control the heating value, wherein the current applied to each channel region CR is proportional to length L2 of each LDD region LR. Accordingly, as the amount of the drain current is reduced, the more the drain current is applied to the channel regions CR of the central portion CP in comparison with the channel regions CR of the edge portions EP, thereby reducing heating value due to the current loss. Thus, as shown in FIG. 5, an excessive temperature rise in the channel regions CR of the central portion CP can be prevented and a uniform temperature heating by each channel region CR can be obtained.

Figure 6:
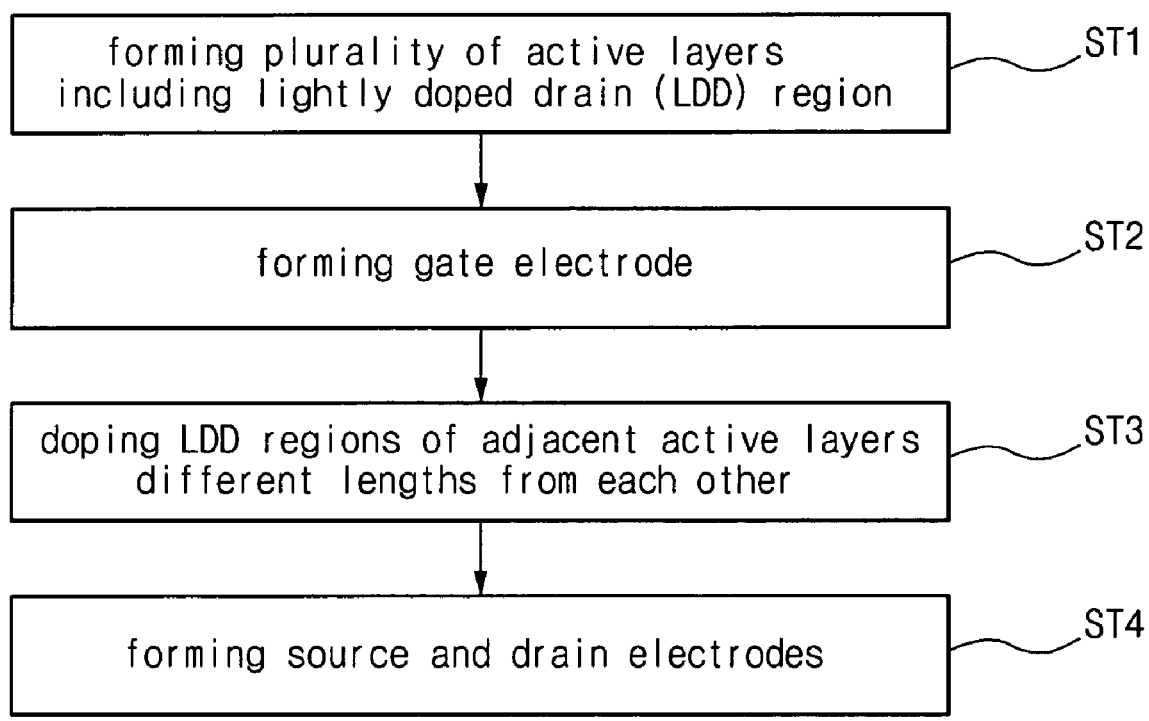
FIG. 6 is a flow chart illustrating an exemplary method of fabricating a multi-channel type TFT according to the present invention.

FIG. 6 is a flow chart illustrating an exemplary method of fabricating a multi-channel type TFT according to the present invention. In a first step ST1, a plurality of active layers are formed on a substrate to extend along a first direction, which are parallel to and spaced apart from each other. Each of the plurality of active layers includes a channel region overlapped with the gate electrode, a source region, a drain region, and lightly doped drain (LDD) regions; one between the channel region and the source region and another one between the channel region and the drain region. Next, a gate-insulating layer is formed on the plurality of active layers.

In a second step ST2, a gate electrode is formed on the gate-insulating layer to extend along a second direction crossing the first direction. The gate electrode is disposed to overlap the channel region.

In a third step ST3, the LDD regions are doped with impurities of a first concentration. The LDD regions of the adjacent active layers have different lengths from each other. Next, the source and drain regions are doped with impurities of a second concentration larger than the first concentration.

In a fourth step ST4, source and drain electrodes are formed over the gate electrode and spaced apart from each other along the second direction. The source and drain electrodes are connected to the source and drain regions. Furthermore, an interlayer is formed on the source and drain electrodes and a passivation layer is formed on the interlayer.

Figure 7:
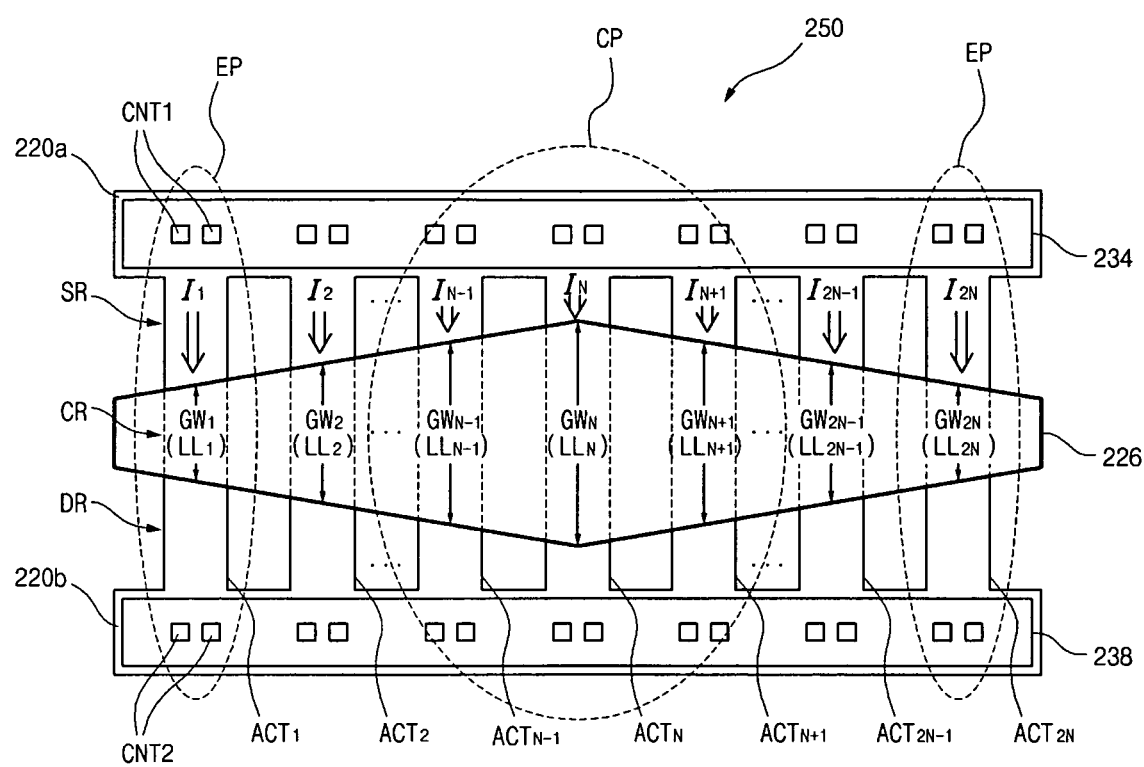
FIG. 7 is a schematic plan view of another exemplary multi-channel type TFT according to the present invention.

FIG. 7 is a schematic plan view of another exemplary multi-channel type TFT according to the present invention. In FIG. 7, a multi-channel type TFT 250 includes a gate electrode 226 over a substrate (not shown) to extend along a first direction, source and drain electrodes 234 and 238 spaced apart from each other with respect to the gate electrode 226 and also extend along the first direction. In addition, a plurality of active layers $ACT_1$ to $ACT_{2N}$ parallel to and spaced apart from each other extend along a second direction crossing the first direction. Each of the plurality of active layers $ACT_1$ to $ACT_{2N}$ include a channel region CR overlapped with the gate electrode 226, a source region SR in one side of the channel region CR, a drain region DR in another side of the channel region CR, wherein overlapping widths $GW_1$ to $GW_{2N}$ of the gate electrode 226 with the adjacent active layers $ACT_1$ to $ACT_{2N}$ are different from each other, and lengths $LL_1$ to $LL_{2N}$ of the adjacent channel regions CR are different from each other.

As shown in FIG. 7, the plurality of active layers $ACT_1$ to $ACT_{2N}$ diverge from first and second connecting patterns 220a and 20b in which each of active layers $ACT_1$ to $ACT_{2N}$ are connected to the source and drain regions SR and DR, respectively. At this time, the first and second connecting patterns 220a and 220b are connected to the source and drain regions SR and DR via first and second contact holes CNT 1 and CNT 2 of an interlayer (not shown), respectively.

More specifically, the width W3 of the gate electrode 226 gradually increases from an outside direction to an inside direction, and the gate electrode 226 has a symmetrical structure with respect to the central active layers $ACT_{N-1}$ to $ACT_{N+1}$. Accordingly, the resulting structure of the gate electrode 226 is formed to apply a smaller current to the channel regions CR of the central active layers $ACT_{N-1}$ to $ACT_{N+1}$ than to the channel regions CR of the side active layers $ACT_1$ and $ACT_{2N}$. That is, the amount of currents $I_1$ to $I_{2N}$ applied to the multi-channel type TFT 250 are inversely proportional to lengths the channel region CR, wherein the amount of the current applied to the channel regions CR of the central active layer $ACT_N$ is represented as:

$$I_N = [GW_1 \cdot GW_N] \times I_1 \qquad (2)$$

Accordingly, the more the central widths $GW_{N-1}$ to $GW_{N+1}$ of the gate electrode 226 increase, the more the lengths $LL_1$ to $LL_{2N}$ of the channel regions CR from the edge portions EP to the central portion CP of the channel regions CR increase. Thus, since the amount of the drain current is reduced and the heating value due to the current loss decreases, the excessive temperature rise of the channel regions CR of the central active layers $ACT_{N-1}$ to $ACT_{N+1}$ can be improved. Although not shown, LDD regions LR may be defined between the source region SR and the gate electrode 226 and between the drain region DR and the gate electrode 226.

Figure 8:
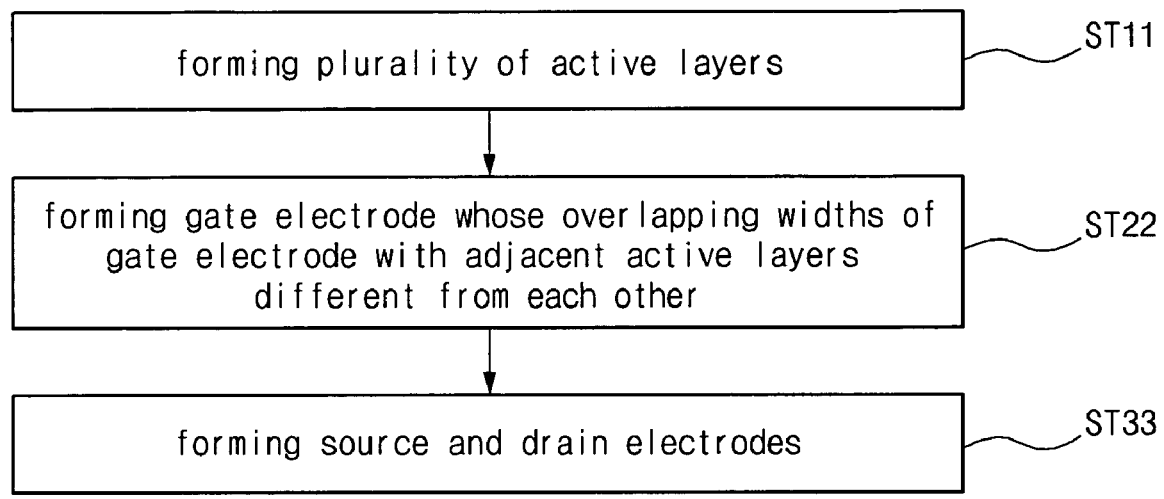
FIG. 8 is a flow chart illustrating another exemplary method of fabricating a multi-channel type TFT according to the present invention.

FIG. 8 is a flow chart illustrating another exemplary method of fabricating a multi-channel type TFT according to the present invention. In a first step ST11, a plurality of active layers are formed on a substrate to extend along a first direction, which are parallel to and spaced apart from each other. Each of the plurality of active layers includes a channel region overlapped with the gate electrode, a source region in one side of the channel region, a drain region in another side of the channel region. Next, a gate-insulating layer is formed on the plurality of active layers.

In a second step ST22, a gate electrode is formed on the gate-insulating layer to extend along a second direction crossing the first direction, wherein overlapping widths of the gate electrode with the adjacent active layers are different from each other and channel lengths of the adjacent channel regions are different from each other.

In a third step ST33, the source and drain regions are doped to a predetermined concentration. Next, source and drain electrodes are formed over the gate electrode to extend along the second direction, which are spaced apart from each other with respect to the gate electrode and connected to the source and drain regions. Next, an interlayer is formed on the source and drain electrodes and a passivation layer is formed on the interlayer.

Figure 9:
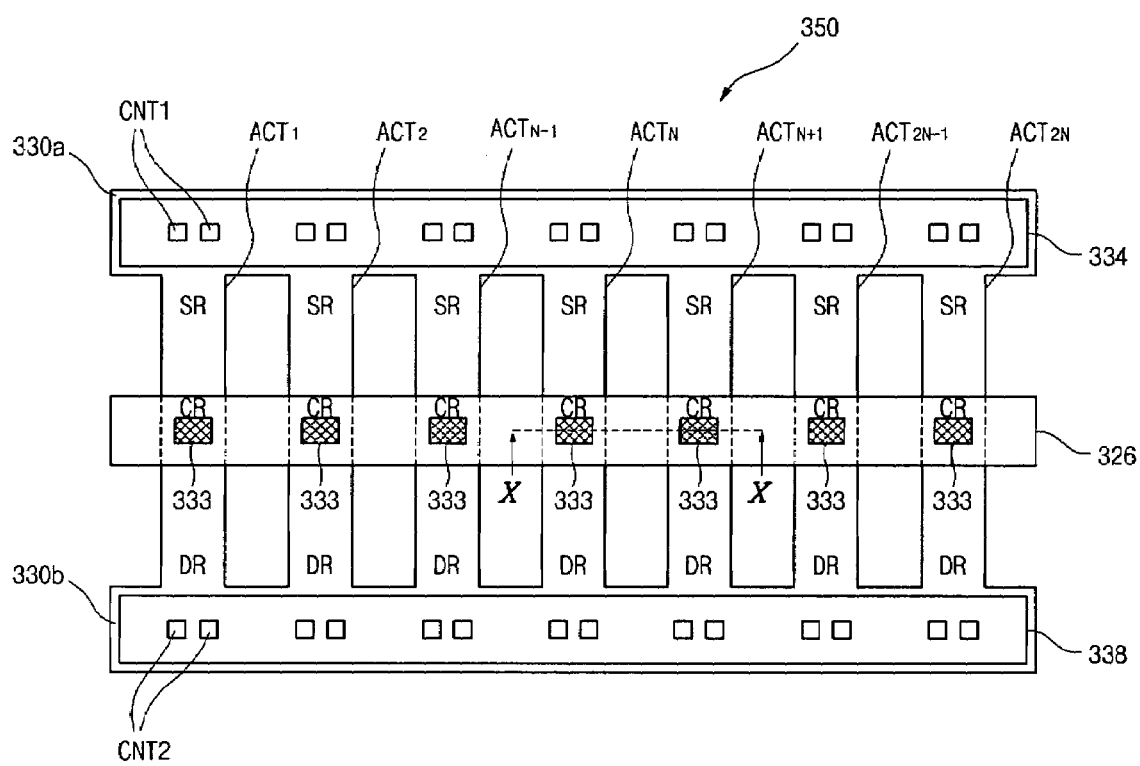
FIG. 9 is a schematic plan view of another exemplary multi-channel type TFT according to the present invention.
Figure 10:
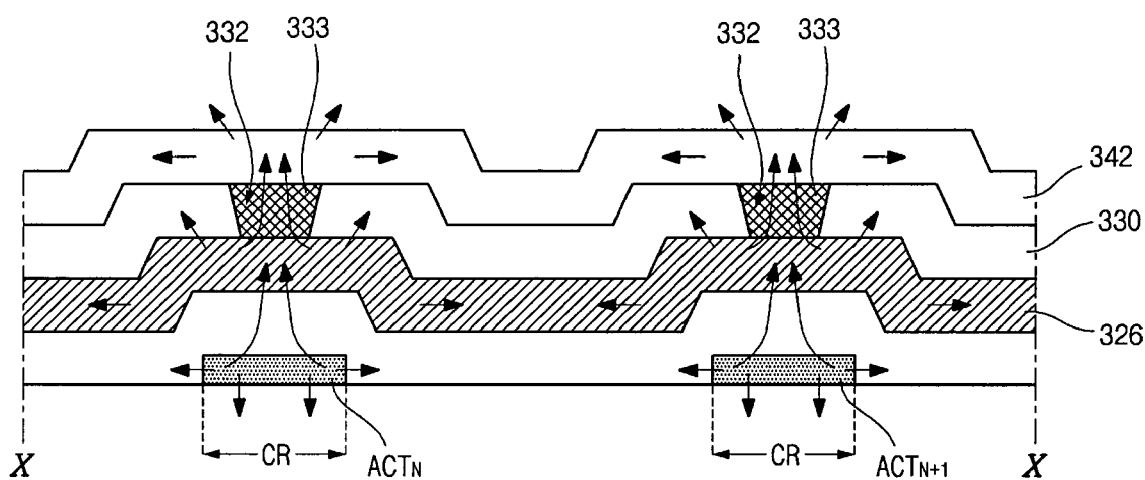
FIG. 10 is a schematic cross-sectional view along X—X of FIG. 7 according to the present invention.

FIG. 9 is a schematic plan view of another exemplary multi-channel type TFT according to the present invention, and FIG. 10 is a schematic cross-sectional view along X—X of FIG. 7 according to the present invention. In FIGS. 9 and 10, a multi-channel type TFT 350 includes a gate electrode 326 over a substrate (not shown) to extend along a first direction, source and drain electrodes 334 and 338 spaced apart from each other with respect to the gate electrode 326 also extend along the first direction. In addition, a plurality of active layers $ACT_1$ to $ACT_{2N}$ are formed parallel to and spaced apart from each other along a second direction crossing the first direction. Each of the plurality of active layers $ACT_1$ to $ACT_{2N}$ include a channel region CR overlapped with the gate electrode 326, a source region SR in one side of the channel region CR, a drain region DR in another side of the channel region CR, and an interlayer 330 between the gate electrode 326 and the source and drain electrode 334 and 338. The interlayer 330 has a plurality of contact holes 332 that partially expose the gate electrode 326, and a plurality of contact patterns 333 contact the gate electrode 326 through the plurality of contact holes 332, wherein the plurality of contact patterns 333 include the same material(s) as the source and drain electrodes 334 and 338. In other words, the contact patterns 333 include a metallic material having high heat conductivity for effective heat conduction toward an arrow direction. The first and second connecting patterns 320a and 320b are connected to the source and drain regions SR and DR via first and second contact holes CNT 1 and CNT 2 of the interlayer 330, respectively. In addition, a passivation layer 342 is formed on the interlayer 330 including the contact patterns 333. For example, the passivation layer 342 includes an inorganic material, such as a silicon nitride. Accordingly, the conducted heat from the channel regions CR can be widely diffused from the passivation layer 342 using the contact patterns 333, thereby preventing deterioration of the multi-channel type TFT 350. Here, the contact patterns 333 function to provide a thermal cooling efficiency with respect to the whole of the LCD panel. Although not shown, LDD regions may be defined between the source region SR and the gate electrode 326 and between the drain region DR and the gate electrode 326.

Figure 11:
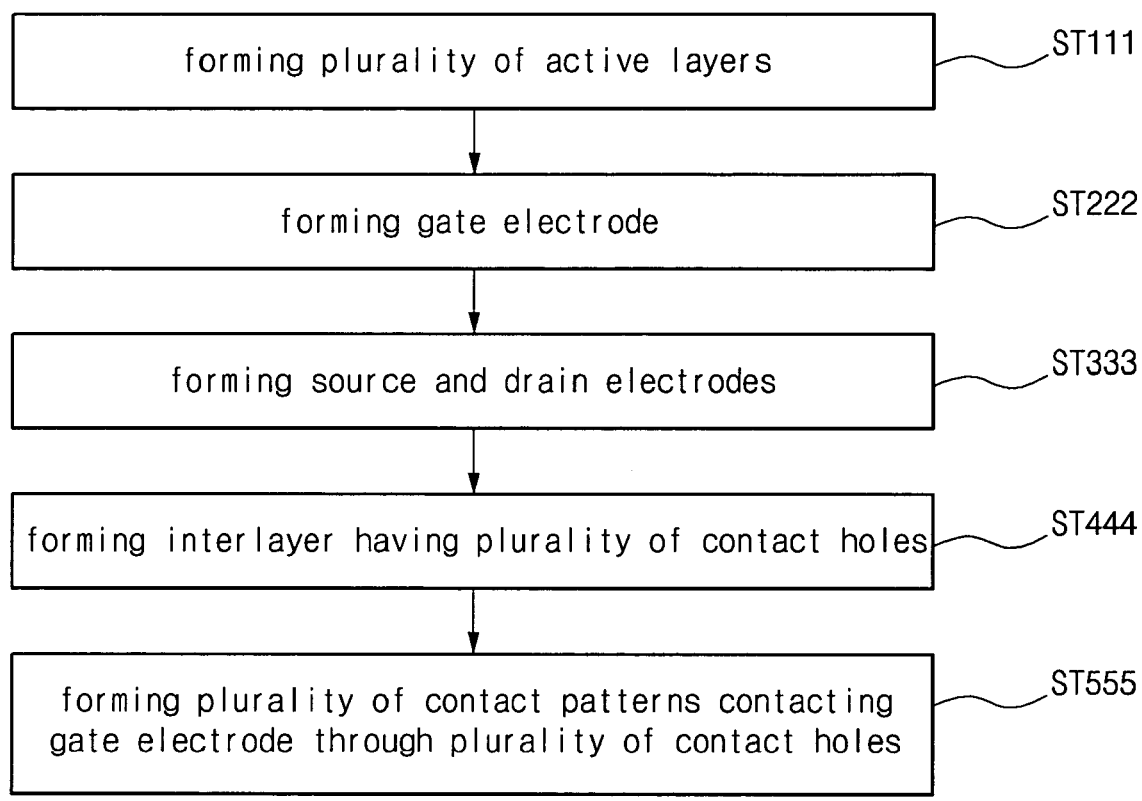
FIG. 11 is a flow chart illustrating another exemplary method of fabricating a multi-channel type TFT according to the present invention.

FIG. 11 is a flow chart illustrating another exemplary method of fabricating a multi-channel type TFT according to the present invention. In a first step ST111, a plurality of active layers are formed on a substrate to extend along a first direction, which are parallel to and spaced apart from each other, wherein each of the plurality of active layers includes a channel region overlapped with the gate electrode, a source region in one side of the channel region, and a drain region in another side of the channel region. Next, a gate-insulating layer is formed on the plurality of active layers.

In a second step ST222, a gate electrode is formed on the gate-insulating layer to extend along a second direction crossing the first direction. Next, the source region and the drain region are doped with a predetermined concentration.

In a third step ST333, source and drain electrodes are formed over the gate electrode to extend along the second direction, which are spaced apart from each other with respect to the gate electrode and connected to the source and drain regions.

In a fourth step ST444, an interlayer is formed between the gate electrode and the source and drain electrodes. The interlayer has a plurality of contact holes that partially expose the gate electrode.

In a fifth step ST555, a plurality of contact patterns are formed on the interlayer and contact the gate electrode through the plurality of contact holes. The plurality of contact patterns includes the same material(s) as the source and drain electrodes. Next, a passivation layer is formed on the contact patterns. For example, the passivation layer includes an inorganic material, such as a silicon nitride.

In accordance with the multi-channel type TFT and the method of fabricating the same according to the present invention can prevent deterioration of the multi-channel type TFT without significant modification of a method process using joule heating and self heating.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. A multi-channel type thin film transistor, comprising:
   a gate electrode over a substrate extending along a first direction;
   a plurality of active layers parallel to and spaced apart from each other extending along a second direction crossing the first direction; and
   source and drain electrodes spaced apart from each other with respect to the gate electrode and extending along the first direction,
   wherein each of the plurality of active layers includes a channel region overlapped with the gate electrode, a source region, a drain region, and lightly doped drain (LDD) regions, one between the channel region and the source region and another one between the channel region and the drain region,
   wherein the LDD regions of the adjacent active layers have different lengths from each other.

2. The thin film transistor according to claim 1, wherein a length of the LDD region of a central portion of the active layer is longer than a length of the LDD region of an edge portion of the active layer.

3. The thin film transistor according to claim 2, wherein the LDD regions have a symmetrical size with respect to the central portion.

4. The thin film transistor according to claim 3, wherein sizes of the LDD regions gradually increase toward the central portion.

5. The thin film transistor according to claim 1, further comprising a passivation layer on the source and drain electrodes.

6. The thin film transistor according to claim 5, wherein the passivation layer includes an inorganic insulating material.

7. The thin film transistor according to claim 1, wherein the active layer includes a polysilicon material.

8. A multi-channel type thin film transistor, comprising:
   a gate electrode over a substrate extending along a first direction;
   source and drain electrodes spaced apart from each other with respect to the gate electrode extending along the first direction; and
   a plurality of active layers extending parallel to and spaced apart from each other along a second direction crossing the first direction, each of the plurality of active layers including a channel region overlapped with the gate electrode, a source region in one side of the channel region, a drain region in another side of the channel region,
   wherein overlapping widths of the gate electrode with the adjacent active layers are different from each other and channel lengths of the adjacent channel regions different from each other.

9. The thin film transistor according to claim 8, wherein a width of the gate electrode in a central portion of the active layer is longer than a width of the gate electrode in an edge portion of the active layer.

10. The thin film transistor according to claim 8, wherein the gate electrode has a symmetrical size with respect to the central portion.

11. The thin film transistor according to claim 10, wherein widths of the gate electrode gradually increase toward the central portion.

12. The thin film transistor according to claim 8, further comprising a passivation layer on the source and drain electrodes.

13. The thin film transistor according to claim 12, wherein the passivation layer includes an inorganic insulating material.

14. The thin film transistor according to claim 8, wherein the active layer includes polysilicon material.

15. A multi-channel type thin film transistor, comprising:
    a gate electrode over a substrate extending along a first direction;
    source and drain electrodes spaced apart from each other with respect to the gate electrode extending along the first direction;
    a plurality of active layers extending parallel to and spaced apart from each other along a second direction crossing the first direction, each of the plurality of active layers including a channel region overlapped with the gate electrode, a source region in one side of the channel region, and a drain region in another side of the channel region;
    an interlayer between the gate electrode and the source and drain electrode, the interlayer having a plurality of contact holes that partially expose the gate electrode; and
    a plurality of contact patterns on the interlayer, the contact patterns contact the gate electrode through the plurality of contact holes,
    wherein the plurality of contact patterns including the same material as the source and drain electrodes.

16. The thin film transistor according to claim 15, wherein the passivation layer includes an inorganic insulating material.

17. The thin film transistor according to claim 16, wherein the active layer includes polysilicon material.

* * * * *